(12) United States Patent
Hla et al.

(10) Patent No.: US 9,362,476 B2
(45) Date of Patent: Jun. 7, 2016

(54) ENGINEERING OF AN ULTRA-THIN MOLECULAR SUPERCONDUCTOR BY CHARGE TRANSFER

(75) Inventors: Saw Wai Hla, Athens, OH (US);
Abdelrahim Hassanien, Ljubljana (SI);
Kendal Clark, Clinton, TN (US)

(73) Assignee: Ohio University, Athens, OH (US)

( * ) Notice: Subject to any disclaimer, the term of this patent is extended or adjusted under 35 U.S.C. 154(b) by 37 days.

(21) Appl. No.: 13/593,592

(22) Filed: Aug. 24, 2012

(65) Prior Publication Data
US 2013/0040822 A1 Feb. 14, 2013

Related U.S. Application Data

(63) Continuation of application No. PCT/US2011/030165, filed on Mar. 28, 2010.

(60) Provisional application No. 61/317,810, filed on Mar. 26, 2010.

(51) Int. Cl.
*H01L 39/00* (2006.01)
*H01L 39/24* (2006.01)

(52) U.S. Cl.
CPC ........................................ *H01L 39/24* (2013.01)

(58) Field of Classification Search
USPC ............... 505/473, 732, 819, 300, 210, 434;
427/62, 255.6, 384; 204/192.1, 192.24, 204/192.36
See application file for complete search history.

(56) References Cited

U.S. PATENT DOCUMENTS

| 4,220,959 | A | | 9/1980 | Kroger | |
|---|---|---|---|---|---|
| 5,094,880 | A | * | 3/1992 | Hongoh | 427/62 |
| 5,122,509 | A | * | 6/1992 | Beetz et al. | 505/161 |
| 5,229,845 | A | * | 7/1993 | Ueba et al. | 257/40 |
| 5,739,086 | A | * | 4/1998 | Goyal et al. | 505/473 |
| 2009/0297980 | A1 | * | 12/2009 | Iwashita et al. | 430/270.1 |
| 2009/0298991 | A1 | * | 12/2009 | Kwon et al. | 524/443 |
| 2009/0317745 | A1 | * | 12/2009 | Mimura et al. | 430/281.1 |

FOREIGN PATENT DOCUMENTS

| CN | 101299452 A | | 11/2008 |
|---|---|---|---|
| JP | 03-085776 A | * | 4/1991 |
| JP | 03138139 A | * | 6/1991 |
| JP | 2006351803 A | * | 12/2006 |

OTHER PUBLICATIONS

Kobayashi et al, "New organic superconductor, k-(BETS)2GaCl4 and metal-insulator transition of BETS conductor with magnetic anions (BETS=bis(ethlenedithio)tetraselenafulvalene)," Synthetic Metals 70 (1995) 867-870.*

Suzuki et al, "Superconductivity and pseudogap states studied by microwave conductivity measurements of lamba-(BEDT-TSF)2GaCl4," Physica C 440 (2006) 17-24.*

(Continued)

*Primary Examiner* — Paul Wartalowicz
(74) *Attorney, Agent, or Firm* — Wood, Herron & Evans, LLP

(57) ABSTRACT

A method of forming a superconductive device of a single layer of $(BETS)_2GaCl_4$ molecules on a substrate surface which displays a superconducting gap that increases exponentially with the length of the molecular chain is provided.

18 Claims, 9 Drawing Sheets

(56) References Cited

OTHER PUBLICATIONS

Clark et al, "Superconductivity in just four pairs of (BETS)2GaCl4 molecules," Nature Nanotechnology, V5, 2010, pp. 261-265.*
Bulaevskii et al, "Intrinsic Pinning of Vortices as a Direct Probe of the Nonuniform Larkin-Ovchinnikov-Fulde-Ferrell State in Layered Superconductors," Phys. Rev. Lett., 2003, V90, pp. 067003-1 to 067003-4.*
International Searching Authority, Search Report and Written Opinion in PCT/US2011/030165, dated Sep. 2, 2011.
Chinese Patent Office, Office Action in Chinese Patent Application No. 201180011240.6 dated Nov. 24, 2014.
Chinese Patent Office, Office Action in Chinese Application No. 201180011240.6, dated Aug. 18, 2015.

* cited by examiner

ENGINEERING OF AN ULTRA-THIN MOLECULAR SUPERCONDUCTOR BY CHARGE TRANSFER

CROSS-REFERENCE TO RELATED APPLICATIONS

This application claims the priority of PCT Patent Application No. PCT/US11/30165 filed Mar. 28, 2011, entitled ENGINEERING OF AN ULTRA-THIN MOLECULAR SUPERCONDUCTOR BY CHARGE TRANSFER which claims the priority of U.S. Provisional Application Ser. No. 61/317,810 filed Mar. 26, 2010.

STATEMENT REGARDING FEDERALLY FUNDED RESEARCH

This invention was made with government support under Grant Number DE-FG02-02ER46012 awarded by the United States Department of Energy, Basic Energy Sciences. The government has certain rights in the invention.

FIELD

The invention relates generally to superconductive articles, and more specifically methods for forming superconductive articles.

BACKGROUND

"Organic" superconductors are part of the organic conductor family which includes molecular salts, polymers and pure carbon systems (including carbon nanotubes and $C_{60}$ compounds). The molecular salts within this family are large organic molecules that exhibit superconducting properties at very low temperatures. For this reason they are often referred to as "molecular" superconductors. Their existence was theorized in 1964 by Bill Little of Stanford University. But the first organic superconductor $(TMTSF)_2 P_6$ was not actually synthesized until 1980 by Danish researcher Klaus Bechgaard of the University of Copenhagen and French team members D. Jerome, A. Mazaud, and M. Ribault. About 50 organic superconductors have since been found with $T_c$'s extending from 0.4 K to near 12 K (at ambient pressure). Since these $T_c$'s are in the range of Type I superconductors, engineers have yet to find a practical application for them. However, their rather unusual properties have made them the focus of intense research. These properties include giant magnetoresistance, rapid oscillations, quantum hall effect, and more (similar to the behavior of InAs and InSb). In early 1997, it was, in fact $(TMTSF)_2PF_6$ that a research team at SUNY discovered could resist "quenching" up to a magnetic field strength of 6 tesla. Ordinarily, magnetic fields a fraction as strong will completely kill superconductivity in a material.

Organic superconductors are composed of an electron donor (the planar organic molecule) and an electron acceptor (a non-organic anion). A few examples of organic superconductors include:

$(TMTSF)_2 ClO_4$ [tetramethyltraselenafulvalene+acceptor]
$(BETS)_2 GaC_{14}$ [bis(ethylenedithio)tetraselenafulvalene+acceptor]
$(BEDO-TTF)_2 ReO_4 H_2 O$
[bis(ethylenedioxy)tetrathiafulvalene+acceptor]

How small can a sample of superconducting material be and still display superconductivity? This question is relevant to the fundamental understanding of superconductivity, and also to applications in nanoscale electronics, because Joule heating of interconnecting wires is a major problem in nanoscale devices. It has been shown that ultrathin layers of metal can display superconductivity, but any limits on the size of superconducting systems remain a mystery. $(BETS)_2 GaCl_4$, where BETS is bis(ethylenedithio)tetraselenafulvalene, is an organic superconductor, and in bulk it has a superconducting transition temperature Tc of ~8 K and a two-dimensional layered structure that is reminiscent of the high-Tc cuprate superconductors.

Organic superconductors are regarded as unconventional superconductors because their properties cannot be explained by the Bardeen-Cooper-Schrieffer (BCS) theory that describes low-temperature superconductors such as lead and bismuth. Although scanning probe methods have provided unprecedented real-space information on both low-Tc BCS superconductors and high-Tc cuprate superconductors, there have only been a handful of reports of scanning tunneling spectroscopy measurements on layered organic superconductors. Moreover, direct visualization of the detailed molecular structures and local spectroscopic mapping of these systems has not yet been performed.

SUMMARY

Using scanning tunneling spectroscopy, it can be shown that a single layer of $(BETS)_2 GaCl_4$ molecules on an Ag(111) surface displays a superconducting gap that increases exponentially with the length of the molecular chain. Moreover, we show that a superconducting gap can still be detected for just four pairs of $(BETS)_2 GaCl_4$ molecules. Real-space spectroscopic images directly visualize the chains of BETS molecules as the origin of the superconductivity.

BRIEF DESCRIPTION OF THE DRAWINGS

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
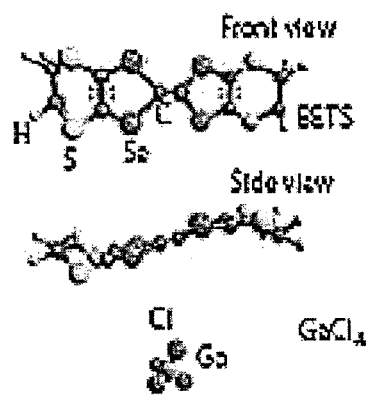
FIG. 1 illustrates individual chemical structures of BETS (top 1A and side 1B views) and $GaCl_4$ (1C.)

One or more aspects of the invention are described with reference to the drawings, wherein like reference numerals are generally utilized to refer to like elements throughout, and wherein the various structures are not necessarily drawn to scale. It will be appreciated that where like acts, events, elements, layers, structures, etc. are reproduced; subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the invention may be practiced with a lesser degree of these specific details. In other instances, known structures are shown in diagrammatic form in order to facilitate describing one or more aspects of the invention.

The invention comprises an ultra-thin (BETS)$_2$-GaCl$_4$ molecular superconductor composed of a single sheet of molecular layer having individual GaCl$_4$ sandwiched between chains of a double domino stacked BETS on a Ag(111) surface.

Figure 2:
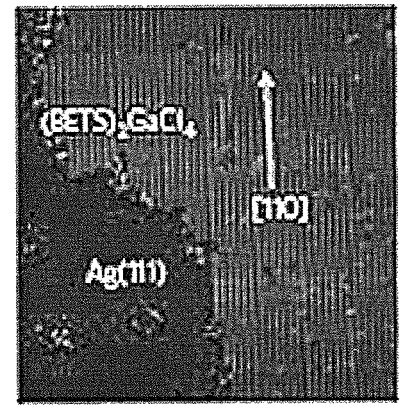
FIG. 2 is an STM (Scanning Tunneling Microscope) image illustrating a monolayer thick $(BETS)_2 GaCl_4$ layer on Ag(111) (87×87 nm$^2$, $V_t$=0.6V, $l_t$=8.6×10$^{-10}$A).
Figure 3:
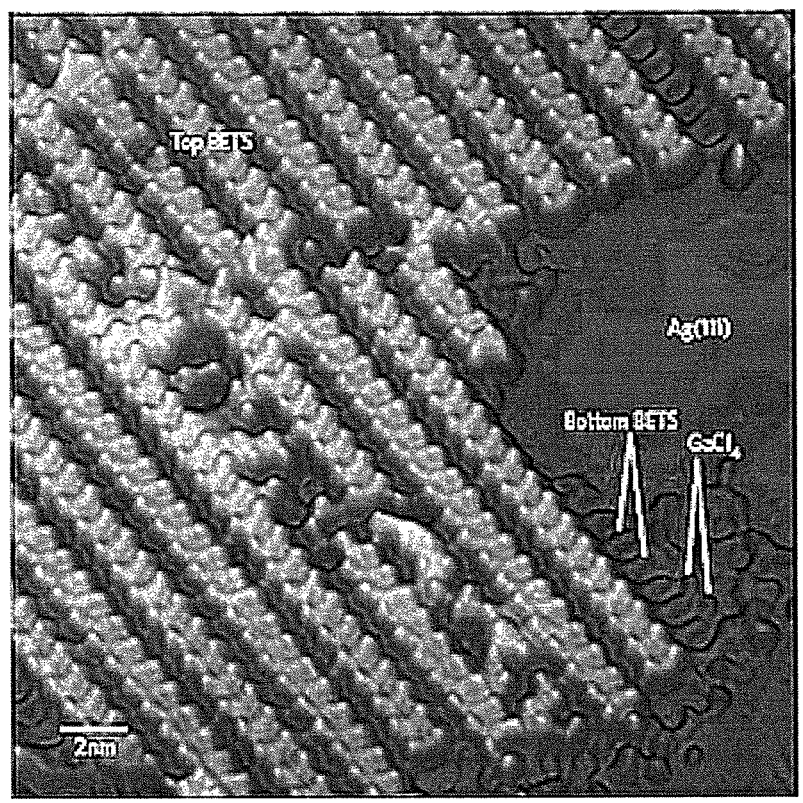
FIG. 3 is an STM image of a λ-$(BETS)_2 GaCl_4$ molecular layer, revealing a double stacked BETS row, together with an unfinished packing of the first layer of BETS and $GaCl_4$ at the edge ($V_t$=0.6V, $l_t$=8.6×10$^{-10}$A).
Figure 4:
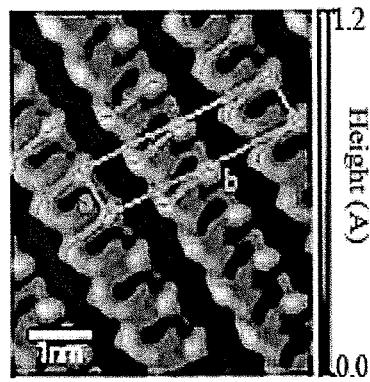
FIG. 4 is an STM image illustrating BETS molecules with bent edges ($V_t$=0.1V, $l_t$=6.8×10$^{-10}$A).
Figure 5:
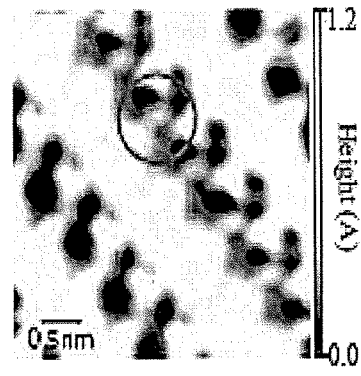
FIG. 5 is a contrast-adjusted STM image illustrating the $GaCl_4$ locations between the BETS chains as protrusions. A $GaCl_4$ molecule is indicated ($V_t$=15 mV, $l_t$=1.0×10$^{-10}$A).
Figure 6:
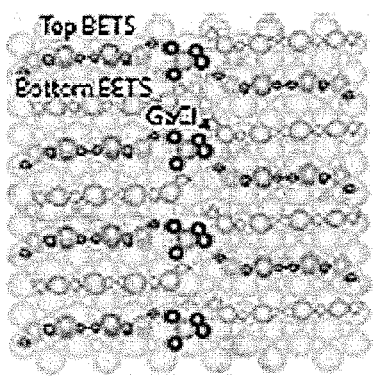
FIG. 6 is a model illustrating the molecular packing on Ag(111).
Figure 18:
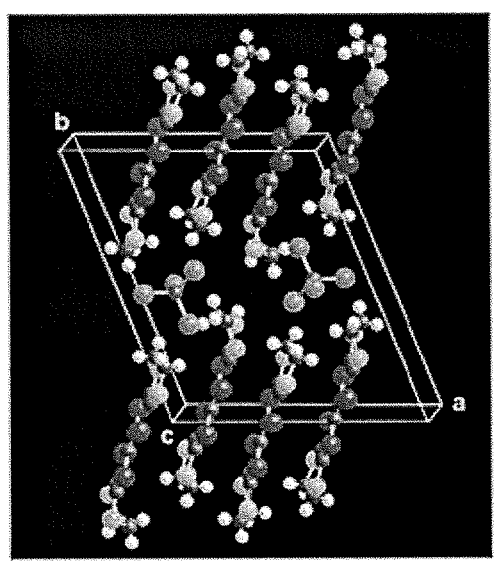
FIG. 18 illustrates the crystal structure of λ-(BETS)$_2$GaCl$_4$ crystals.

The two-dimensional planes in the λ-phase of (BETS)$_2$GaCl$_4$ contain GaCl$_4$ molecules (FIG. 1) that accept electric charge. They are sandwiched between layers of BETS (bis(ethylenedithio)tetraselenafulvalene)-molecules that donate electric charge. A custom-built evaporator for the vacuum deposition of sub-monolayer coverages of λ-(BETS)$_2$GaCl$_4$ molecules on a clean Ag(111) substrate was utilized. The samples were subsequently cooled to liquid-helium temperatures in an ultrahigh vacuum (UHV) environment. Scanning tunneling microscope (STM) images acquired using a custom-built low-temperature UHV-STM system at 5.4 K reveal molecular islands having a single sheet of molecule packing thickness and exposed bare Ag(111) surface areas (FIG. 2). Partial packing arrangements of molecules at the edges of the molecular islands (FIG. 3), predominantly the first layer organization of BETS and GaCl$_4$, indicate that the molecules diffuse and rearrange on the surface upon deposition. The intricate molecular packing arrangement can be observed in STM images of the molecular layer and at the edges of the islands (FIGS. 3-5). The molecular packing arrangement (FIG. 6) was established to be as follows. The double-stacked BETS form long chains along surface close-packed directions 8.7 Å (Angstroms) apart, and the top BETS are shifted laterally between the bottom BETS. This BETS arrangement is the same as that found in bulk crystals (FIG. 18). The GaCl$_4$ molecules are located between the BETS chains, and are also spaced 8.7 Å (Angstroms) apart as in the λ-phase (BETS)$_2$GaCl$_4$ crystal. Thus, the observed surface packing of (BETS)$_2$GaCl$_4$ in the molecular clusters mimics the packing in their bulk counterpart. In the ordered molecular chains, the molecules have the correct ratio, that is, two BETS for each GaCl$_4$. More importantly, the edges of the top BETS appear bent (FIG. 4), reminiscent of the gas-phase BETS structure (FIG. 1). For such bent edges to appear, the BETS need to align with their rings perpendicular to the surface. Here, the highest intensity of BETS appears around the position of the sulphur atoms of the two end p-rings. In this location, the molecule surface interaction should be considerably weakened but the molecule-to-molecule binding should be strengthened.

Figure 7:
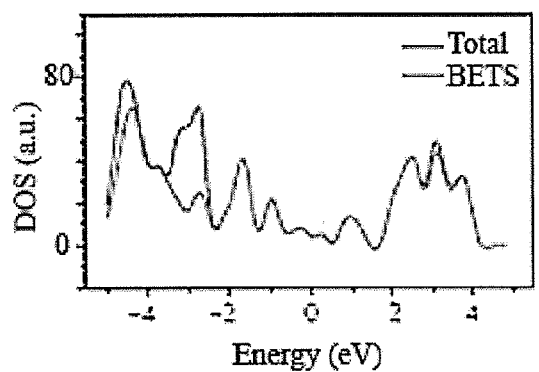
FIG. 7 illustrates calculated DOS for λ-$(BETS)_2 GaCl_4$, revealing that the charge near the Fermi level is mainly contributed by the BETS.

In D$_2$A-type organic superconductors (D=donor, A=acceptor), the two donors transfer a total of one electron to the acceptor, resulting in the donors each having a half-filled electronic orbital, which is crucial for the superconducting transition below a critical temperature. Indeed, our density functional theory (DFT) calculation for a bulk λ-(BETS)$_2$GaCl$_4$ system, using a generalized gradient approximation within the Perdew-Burke-Ernzerhof scheme and a plane wave basis set, reveals a transfer of 0.9 electronic charge from a BETS dimer to a GaCl$_4$. Near the Fermi level, however, the charge is mainly located at the BETS, and only a small amount of charge is contributed from GaCl$_4$ at the low-lying states (FIG. 7). This is apparent in the STM images, where the GaCl$_4$ between the BETS chains have much lower tunneling current intensities (FIG. 5).

Figure 8:
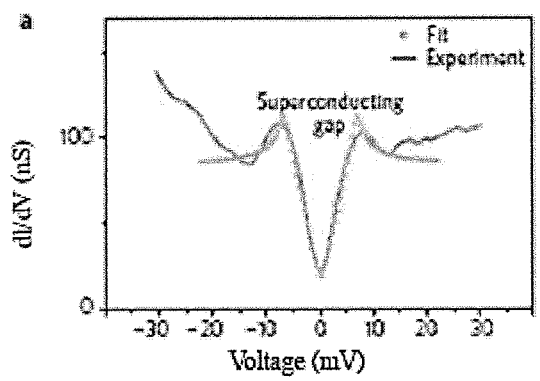
FIG. 8 illustrates a dI/dV curve showing a superconducting gap with a corresponding fit.

A robust superconducting gap is observed on the top BETS layer inside ordered molecular clusters (FIG. 8) when the tunneling spectroscopy data are taken with a higher energy resolution (an a.c. modulation of 0.2 mV, 700-860 Hz). The average measured super conducting gap at 5.4 K is approximately 12 meV and the two maxima near the gap edges are also resolved. This is in agreement with the tunneling spectroscopy of the non-BCS-type bulk molecular superconductors, which exhibit a larger gap than typical BCS superconductors. There is debate over the nature of superconductivity in the organic salts regarding whether it has a d or an s wave pairing symmetry. In an s wave state, the superconducting gap is finite at every point on the Fermi surface. It is, therefore, observed with the gap flat across the bottom. In the d wave state, however, the DOS is anisotropic on the Fermi surface and linearly increases when moving away from the Fermi energy, giving a distinct V-shape to the gap. The λ-$(BETS)_2GaCl_4$ has a triclinic crystal structure. Based on the shape of the first Brillouin zone of $(BETS)_2GaCl_4$, particular regions of momentum space have more weight than others, and therefore the contribution to the tunneling current will have an angular dependence in k space. The best fits for the measured superconducting gaps were achieved by using a $d_{xy}$ symmetry (FIG. 8), and the nodal direction is oriented parallel to the a lattice vector between the BETS chains. The phenomenological formula $$\frac{dI}{dV} \propto \int_0^{2\pi} \int_{-\infty}^{\infty} \text{Re}\left[\frac{|E - i\Gamma|}{\sqrt{(E - i\Gamma)^2 - (\Delta \sin 2\theta)^2}}\right] \cdot f(\theta) \, dE \, d\theta$$

was used for curve fitting. Here, T is the lifetime broadening, Δ is associated with the energy gap, and θ is the azimuthal angle in k space. The weighting function f(θ) is taken as f(θ)=1+α cos 4θ, where α is a directionality constant.

Figure 19A:
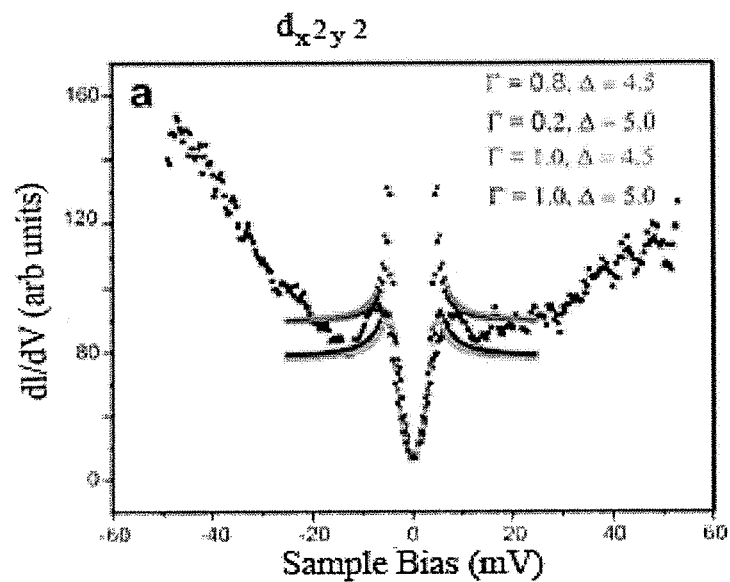
FIGS. 19(a) and 19(b) illustrate superconducting curve fittings for (a) $d_{x^2-y^2}$ and (b) $d_{xy}$ symmetries. The best fit is the orange curve in the $d_{xy}$ symmetry, and the corresponding T□ and Δ□ values are indicated with a rectangle in (b).
Figure 19B:
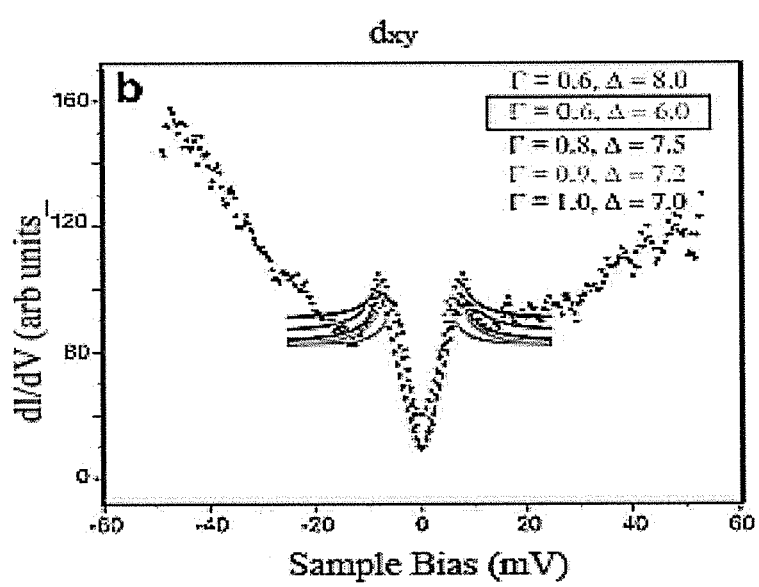

Referring to FIGS. 19(a) and (b), the superconducting curve fits were performed by using the formula:

$$\frac{dI}{dV} \propto \int_0^{2\pi} \int_{-\infty}^{\infty} \text{Re}\left[\frac{|E - i\Gamma|}{\sqrt{(E - i\Gamma)^2 - \Delta_0^2}}\right] \cdot f(\theta) \cdot dE \, d\theta$$

where $\Delta_0=\Delta \cos 2\theta$, and $\Delta_0=\Delta \sin 2\theta$ were used for the $d_{x^2-y^2}$ and $d_{xy}$ symmetries, respectively. The best curve fit was obtained using $d_{xy}$ symmetry with θ approximately π/4, 2Δ=12 meV, and T=0.6.

Figure 9:
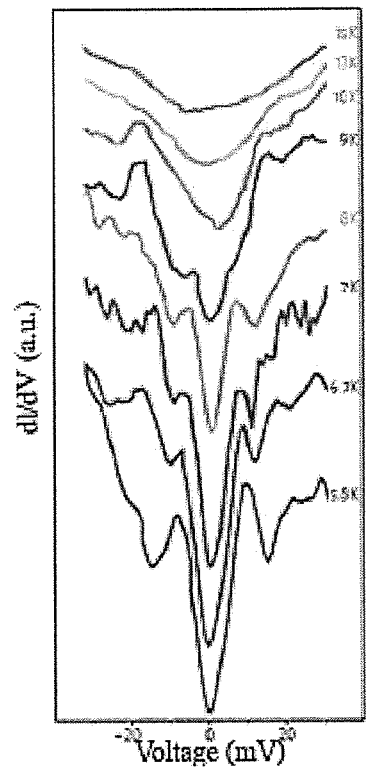
FIG. 9 illustrates the superconducting gap gradually disappearing as the temperature is increased from 5.8K to 15K.
Figure 10:
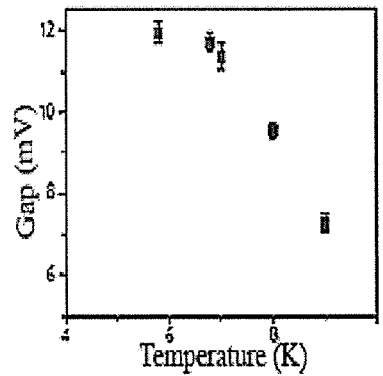
FIG. 10 illustrates the superconducting gap decreasing as the temperature is increased. The error bars indicate the statistical distribution of gaps in different measurements.
Figure 22A:
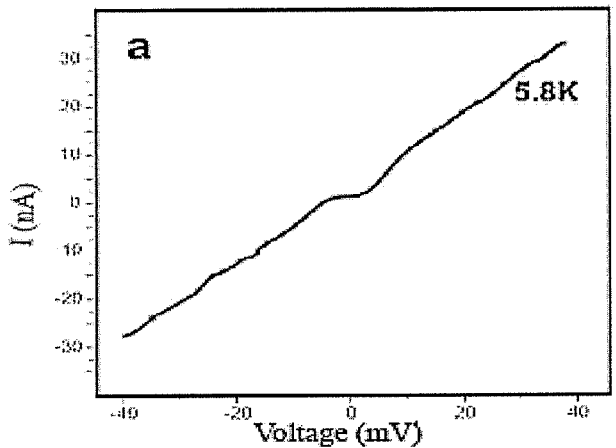
FIGS. 22(a) and 22(b) illustrate I-V tunneling spectroscopy curves of superconducting (a), and metallic (b) states.
Figure 22B:
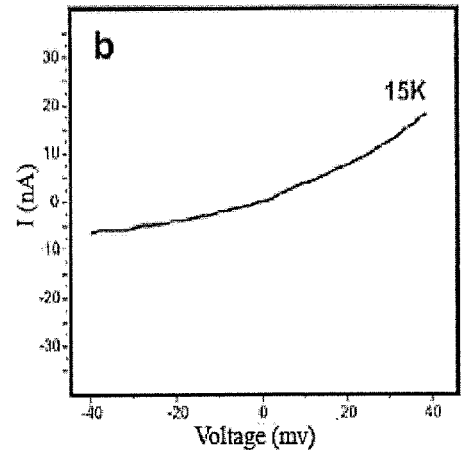

Next, to confirm the observed superconductivity, the superconductor-metal transition was explored by varying the sample temperature. A sequence of dI/dV curves measured over a single large molecular island at different temperatures (FIG. 9) shows that the edge state of the superconducting gap can be clearly observed up to 8 K. When the temperature is raised to 9 K, the superconducting gap is still observed, but the edge states start to disappear. The gap is no longer visible above 10 K. At 15 K, the I-V curve of the sample simultaneously recorded with the dI/dV signal reveals a metallic behaviour without any gap state (FIGS. 22(a) and 22(b)). A corresponding plot of the superconducting gap as a function of temperature is illustrated in FIG. 10. The deduced $2\Delta/kT_c$ value for this system is approximately 13.6. The $2\Delta/kT_c$ values of anisotropic molecular superconductors are known to be larger than the BCS value of 3.52.

I-V and dI/dV-V tunneling spectroscopy data of molecular chains were simultaneously recorded (using a Stanford Instrument SR830 Lock-In Amplifier for the latter case) at different temperatures but at the same locations. I-V curves of molecular chains at 5.8 K exhibit a superconducting gap state around the Fermi energy, i.e. 0 mV (FIG. 22(a)). When the temperature was raised, this gap state disappeared in the I-V data (FIG. 22(b)). The I-V curve at 15K (FIG. 22(b)) shows a continuous increase of current as the bias is increased, indicating a metallic character.

Figure 11:
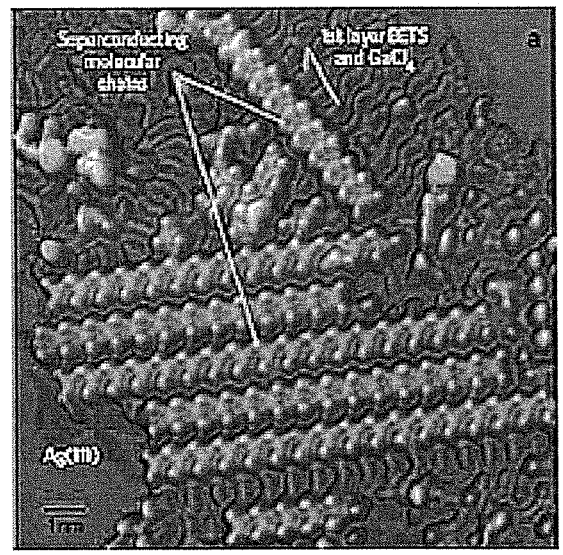
FIG. 11 is an STM image illustrating shorter molecular chains at the centre.
Figure 12:
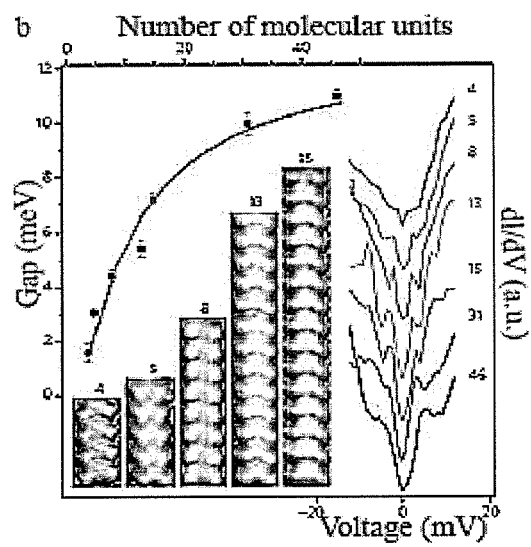
FIG. 12 illustrates the superconducting gap as a function of molecular units with the error bar indicating the statistical distribution of gaps in different measurements. The inset illustrates the molecular chains with 4, 5, 8, 13 and 15 units; the 31 and 46 unit chains are too large to be illustrated. The right inset illustrates the dI/dV data corresponding to these molecular chains.
Figure 21:
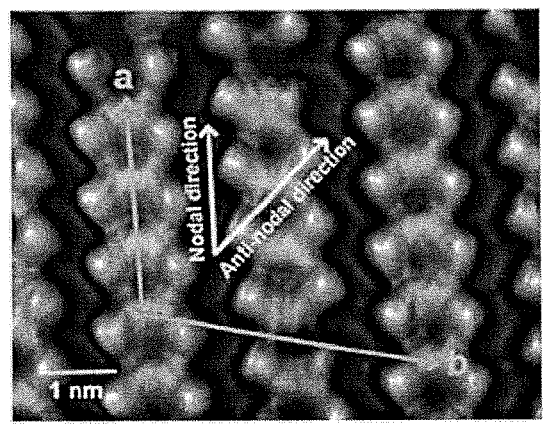
FIG. 21 is an STM image illustrating λ-(BETS)$_2$GaCl$_4$ molecular layer on Ag(111). The orientation of nodal and anti-nodal directions with respect to the BETS chains are indicated with white arrows. The dark arrows indicate the crystallographic 'a' and 'b' directions.

The question of the minimum size of the super conducting system was addressed. The results reported so far have been obtained from large molecular islands containing a number of molecular chains more than 100 nm long, and all had similar values of the superconducting gap. Isolated molecular chains, together with unfinished packing of the BETS and $GaCl_4$, can be found in the smaller molecular islands (FIG. 11). The ordered molecular chains in these islands still exhibit the superconducting gap, and for chains with lengths below 50 nm it was found that the superconducting gap decreases as the chains become shorter (FIG. 12). Moreover, a small superconducting gap can still be detected in chains that contain just four $(BETS)_2GaCl_4$ molecules. These chains have a length of approximately 3.5 nm along the BETS chain, which is in the crystallographic 'a' direction (FIGS. 18, 21). The anisotropic coherence lengths of bulk λ-$(BETS)_2GaCl_4$ are reported as 1.6 nm for the b* direction, and 12.5 nm each for the a* and c directions. These values are comparable by order with our findings. The exponential dependence of the superconducting gap on the chain length indicates that it is dominated by the coherence length within the molecular layer perpendicular to the tunneling direction.

Figure 13:
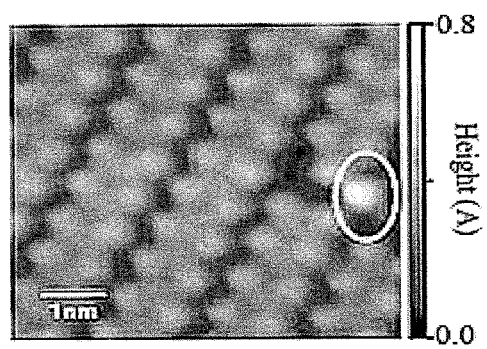
FIGS. 13-15 are STM images of the superconducting gap with (13) and (14) ($V_t$=26 mV, $I_t$=6.8×10$^{-10}$A), and (15) ($V_t$=−2 mV, $I_t$=6.8×10$^{-10}$A).
Figure 14:
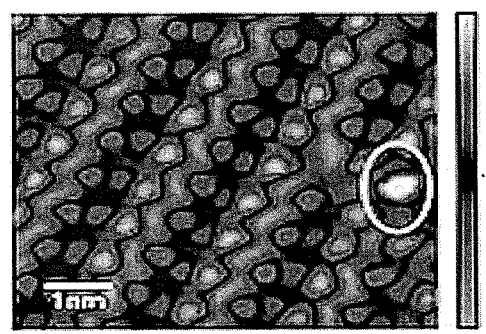
Figure 15:
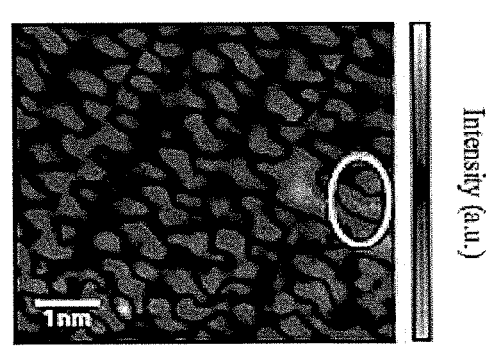

The superconducting gap can be detected ubiquitously throughout the ordered BETS chains in large molecular islands. A sequence of real-space and spectroscopic images, shown in FIGS. 13-15, provides further insight into the spatial distribution of the observed super-conductivity. The spectroscopic map acquired outside the gap shows that the ends of the BETS have a relatively higher intensity (FIG. 14). In the λ-$(BETS)_2GaCl_4$ phase, the $GaCl_4$ molecule is closer to one side of the BETS than the other. This effect can be clearly observed in FIG. 14, where BETS molecules show charge asymmetry; that is, the charge density is more enhanced at one end of the molecule than the other. When the tunneling electron energy is tuned into the gap region, at −2 meV (FIG. 15), the charge density is smeared along the BETS dimers. This spectroscopic image provides direct evidence that the superconducting sites originate in the BETS chains. Remarkably, the spectroscopic images reveal a nanoscale electronic order over the entire island. This further suggests that the coupling between intra-molecular electrons remains strong down to a single sheet of molecular packing rather than a relatively weak molecule-substrate binding.

Figure 23:
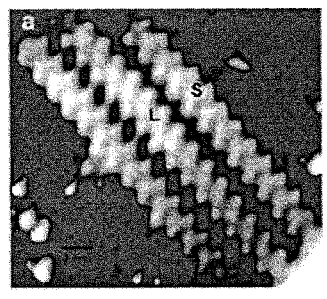
FIG. 23 is an STM image illustrating a smaller cluster containing three molecular chains [Vt=0.6V, It=8.6×10-10A].
Figure 24:
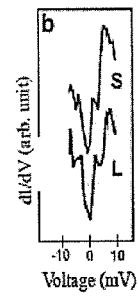
FIG. 24 illustrates the averaged dI/dV data showing superconducting gaps correspond to the chains, 'L' and 'S'.

The dI/dV-V tunneling spectroscopy data of smaller molecular islands on Ag(111) reveal that the superconducting gap is not uniform across the islands, but it is dependent on the length of the molecular chains. FIG. 23 presents an example case. Here, the shorter chain having 12 molecular units is labeled 'S' while a longer chain located next to it composed of 14 molecular units is marked as 'L'. The dI/dV data acquired on these two chains are illustrated in FIG. 24. Both molecular chains exhibit a superconducting gap however the longer chain has a ~7 mV gap while the neighboring shorter chain has a ~6 mV gap. Therefore, the superconducting gap observed here is dependent on the chain length.

Figure 20A:
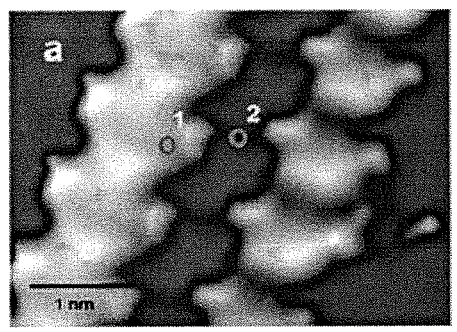
FIG. 20(a) is an STM images illustrating (a) two BETS chains with GaCl$_4$ in between [Vt=0.6V, It=8.6×10-10A], and 20(b), the superconducting gaps measured on BETS and GaCl$_4$ locations indicated in (a) as '1' and '2', respectively.
Figure 20B:
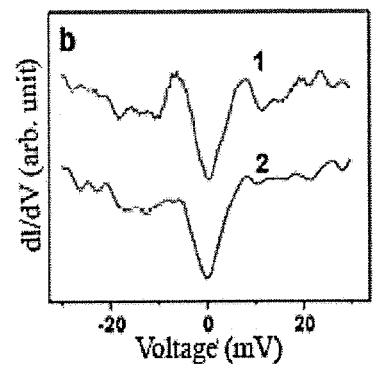

Site dependent superconducting gaps were determined by positioning the STM tip on top of the BETS molecules and on the $GaCl_4$ located between the two BETS chains as indicated in FIG. 20a. The dI/dV-V tunneling spectroscopy data exhibit a superconducting gap together with the two edge states on BETS chains. A superconducting gap state is still observed on $GaCl_4$ however, the two edge states in the gap have disappeared (FIG. 20(b)).

Referring to FIG. 21, the nodal direction is oriented parallel to the 'a' lattice vector and located between the chains as shown in FIG. 21. At these locations the superconducting coherence peaks are minimized. The antinodal states are located on top of the BETS molecules making a 45° orientation with the nodal direction.

According to an embodiment of the invention, fabrication of a superconductive article begins with provision of a substrate. The substrate is generally metal-based and typically comprises a single crystal Ag(III) substrate. However, any type of material can be used.

Figure 16:
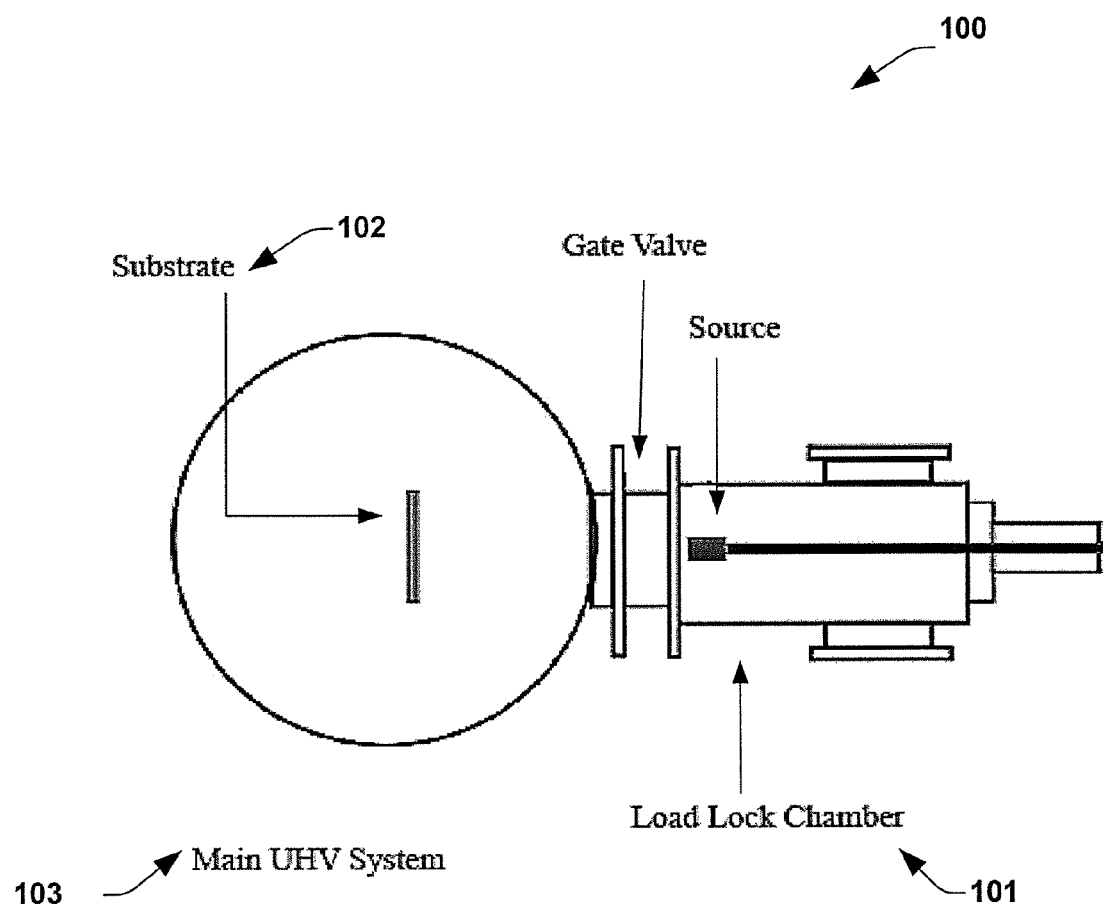
FIG. 16 a layout of an apparatus for use in connection with the deposition of a superconductor layer according to an embodiment of the invention.

Turning to FIG. 16, there is illustrated a layout of an apparatus 100 for use in connection with the deposition of a superconductor layer by the process described below. Apparatus includes evaporator unit that is attached to load lock chamber 101. Evaporator unit includes a Ta capsule to hold source molecules, a resistive heating filament to heat the source molecules, a thermocouple for temperature monitoring, and a shutter. Load lock chamber 101 is equipped with a turbo-molecular pump, a mechanical pump and pressure monitoring. The substrate 102 for the molecules to be deposited on is located in main chamber 103 approximately 20 cm distance from the evaporator unit containing the source molecules.

In one embodiment, in operation, single crystals of the $\lambda$-$(BETS)_2GaCl_4$ compound are placed inside a Ta capsule and loaded into evaporator unit. Evaporator unit attached to load lock chamber 101. The chamber 101 is then pumped down to approximately $2\times10^{-8}$ Torr pressure and held for approximately 12 hours to outgas the source. For further outgassing of source, the evaporator is heated to about 120° C. for 30 minutes prior to deposition of the source molecules.

A substrate is placed in the main chamber 103 and positioned about 20 cm from the source molecules. The $\lambda$-$(BETS)_2GaCl_4$ compound is then deposited by heating of the source to about 160° C. for a deposition time of 20 seconds or less for superconductor wires, or between 30 seconds and 3 minutes for a single sheet of superconducting layer.

In another embodiment, a powder form of BETS molecules are placed inside a Ta capsule and loaded into evaporator unit. The outgassing of the source molecules is then accomplished as previously set forth above. Molecules are deposited by heating the source between 160° C. and 180° C., with the substrate being positioned about 20 cm from the source molecules.

Following deposition of the BETS molecules, $GaCl_4$ or $HaCl_4$ molecules are then deposited, followed by a second deposition of BETS molecules. The substrate is then heated to about 200° C. to obtain a uniform thin film.

The following example is included to demonstrate particular embodiments of the invention. It should be appreciated by those of skill in the art that the techniques disclosed in the example which follows represent techniques discovered by the inventors to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the scope of the invention.

Example 1

Figure 17:
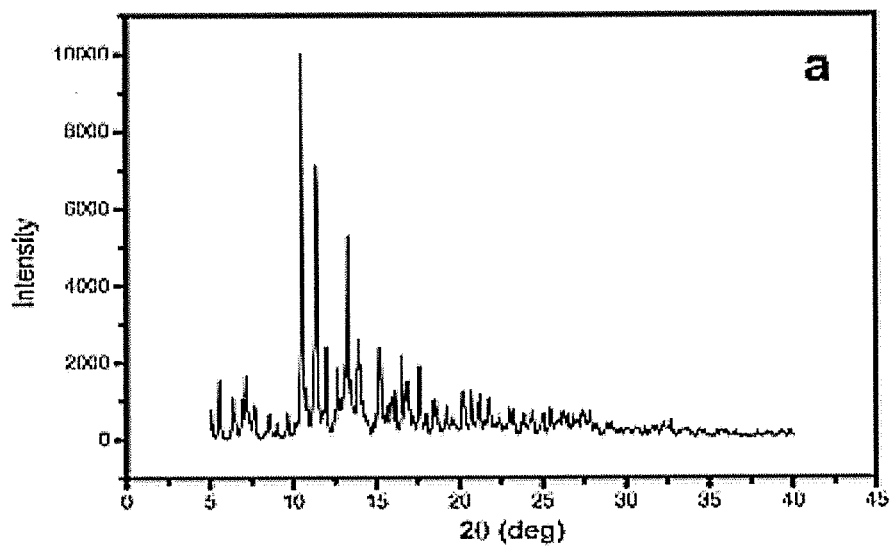
FIG. 17 illustrates an x-ray diffraction pattern of custom-synthesized λ-(BETS)$_2$GaCl$_4$ crystals. The x-ray diffraction measurements were carried out at room temperature using a Rigaku AFC7R diffractometer. Peaks in the diffraction pattern indicate a triclinic crystal structure with a unit cell shown in FIG. 18. The BETS molecules (donors) are stacked along 'a' and 'c' axes, and the GaCl$_4$ molecules (acceptors) are located between the BETS chains.

To prepare $\lambda$-$(BETS)_2GaCl_4$ single crystals, BETS (3 mg) and Et4N—GaCl4 (50 mg) were dissolved in a mixture of chlorobenzene and ethanol (approximately 10.8 ml chlorobenzene, 1.2 ml ethanol). The electrochemical reaction was performed in H-shaped glass tube cells without glass frits. Platinum wires were used as electrodes. A constant current of 0.5 mA was applied for 2 to 3 weeks in different experimental runs. Crystals of very thin needles were obtained a few days after the current was turned on. The needles continued to grow in size, reaching an average length of 1.5 cm at the end of the reaction period. Typical dimensions of the single needle crystals obtained were 100 mm×100 mm×1.5 cm along crystallographic a, b and c axes, respectively. The X-ray diffraction pattern of the grown $\lambda$-$(BETS)_2GaCl_4$ needles (FIG. 16) shows a triclinic crystal structure with the following unit cell parameters: a=16.1544(14) Angstroms (Å), b=18.5976(16) Å, c=a 6.5946(6) Å, $\alpha$=96.736(2), $\beta$=98.370(2), $\gamma$=112.562(2) and V=1777.13 Å. The BETS molecules were arranged along the [100] directions (FIG. 17).

The custom evaporator unit for the molecule deposition included a Ta capsule, a resistive heating filament, a thermocouple for temperature monitoring and a shutter. For deposition of molecules, $\lambda$-$(BETS)_2GaCl_4$ single crystals were placed in a Ta capsule. After loading the compound, the evaporator unit was attached to a load-lock chamber of the UHV system and then pumped to a pressure of $2\times10^{-8}$ torr for 12 hours to outgas. To further outgas the source, the evaporator was heated to 120° C. for 30 min. For the substrate, a Ag(111) single-crystal surface was cleaned by 11 cycles of sputtering with neon ions and annealing to 700 K. The sample temperature was then lowered to 80 K inside the STM chamber and the cleanliness of the sample checked by STM imaging.

After confirming an atomically clean sample surface, it was placed in the Ultra High Vacuum (UHV)-manipulator equipped with x, y, z and rotational stages, and heating/cooling facilities. During molecule deposition, the sample temperature was held at approximately 120 K. The $\lambda$-$(BETS)_2GaCl_4$ compound was deposited by heating the source to 160° C. under UHV condition inside the deposition chamber of a custom-built UHV-LT-STM system.

The observation of superconductivity in just four pairs of $(BETS)_2GaCl_4$ molecules opens up the possibility of investigating the superconducting phenomena locally. It might also lead to the fabrication of nanoscale superconducting devices based entirely on molecular materials, and to nanoscale electronic circuits that use superconducting nanowires as interconnects.

Although one or more aspects of the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and/or advantageous for any given or particular application. Further, the term "exemplary" as used herein merely meant to mean an example, rather than the best. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming a superconductive article comprising a single sheet of a molecular superconductor material wherein the method comprises:

a) preparing a source of single crystals of the superconductor material, said source comprising single crystals of said superconductor material;

b) preparing a single crystal substrate; and c) depositing the single sheet of superconductor material from the source by vacuum deposition to the substrate, wherein the substrate comprises a metal substrate and wherein the substrate comprises Ag (111).

2. The method of claim 1, wherein the single crystals of superconductor material comprise $\lambda\text{-}(BETS)_2GaCl_4$.

3. The method of claim 2, wherein the superconducting gap increases exponentially with the length of molecular chain formed by the $\lambda\text{-}(BETS)_2GaCl_4$ molecules.

4. The method of claim 1, wherein the single sheet of molecular superconductor comprises a nanolayer.

5. The method of claim 4, wherein the nanolayer has a thickness of about 0.7 nm.

6. The method of claim 1, wherein the crystals of superconductor material are deposited at a temperature of about 120K.

7. The method of claim 1, wherein the source of superconductor material is heated to a temperature of about 160° C.

8. The method of claim 1, wherein the source is placed about 20 cm from the substrate.

9. The method of claim 1, wherein the superconductive article comprises one or more of a superconductive film or wire.

10. The method of claim 1, wherein depositing includes heating the source to evaporate the single crystals.

11. A method of forming a superconductive layer comprising:

providing a single crystal substrate;

providing a source of BETS molecules in powder form;

depositing BETS molecules by heating the source between about 160° C. and about 180° C., with the substrate being positioned about 20 cm from the source molecules;

depositing $GaCl_4$ molecules;

depositing a second deposition of BETS molecules;

heating the substrate to about 200° C. to obtain a single sheet of a superconductive layer.

12. The method of claim 11, wherein the single sheet comprises a nanolayer.

13. The method of claim 11, wherein the depositing is by vacuum deposition.

14. A method of forming an organic $BETS_2A$-type superconductor comprising:

evaporating a first material comprising BETS molecules to evaporate the BETS molecules;

depositing the evaporated BETS molecules onto a single crystal substrate;

evaporating a second material comprising A molecules;

depositing the evaporated A molecules onto the deposited BETS molecules;

depositing the BETS molecules onto the deposited A molecules; and heating the substrate to obtain the organic $BETS_2A$-type superconductor.

15. The method of claim 14, wherein the first material is in powder form.

16. The method of claim 14, wherein the A molecules are molecules of $GaCl_4$ so as to produce a $\lambda\text{-}(BETS)_2GaCl_4$ superconductor.

17. A method of forming a superconductive article comprising a single sheet of a molecular superconductor material wherein the method comprises:

a) preparing a source of single crystals of the superconductor material, said source comprising single crystals of said superconductor material;

b) preparing a single crystal substrate; and c) depositing the single sheet of superconductor material from the source by vacuum deposition to the substrate, wherein the single crystals of superconductor material comprise $\lambda\text{-}(BETS)_2GaCl_4$.

18. A method of forming a superconductive article comprising a single sheet of a molecular superconductor material wherein the method comprises:

a) preparing a source of single crystals of the superconductor material, said source comprising single crystals of said superconductor material;

b) preparing a single crystal substrate; and c) depositing the single sheet of superconductor material from the source by vacuum deposition to the substrate, wherein the crystals of superconductor material are deposited at a temperature of about 120K.

* * * * *